United States Patent [19]
Rhodes

[11] Patent Number: 5,731,610
[45] Date of Patent: Mar. 24, 1998

[54] SEMICONDUCTOR DEVICE HAVING IMPROVED CONTACTS TO A THIN CONDUCTIVE LAYER

[75] Inventor: Howard E. Rhodes, Boise, Id.

[73] Assignee: Micron Technology, Inc., Boise, Id.

[21] Appl. No.: 733,340

[22] Filed: Oct. 17, 1996

Related U.S. Application Data

[60] Continuation of Ser. No. 475,454, Jun. 5, 1995, abandoned, which is a division of Ser. No. 399,844, Mar. 7, 1995, abandoned.

[51] Int. Cl.$^6$ .................. H01L 29/73; H01L 129/68; H01L 29/92
[52] U.S. Cl. .................. 257/309; 257/773; 257/67; 257/68; 257/71; 257/30; 257/754; 257/306; 257/296
[58] Field of Search .................. 257/773, 67, 68, 257/71, 72, 306, 296–313, 66, 30, 530, 309, 754

[56] References Cited

U.S. PATENT DOCUMENTS

| | | | |
|---|---|---|---|
| 4,754,313 | 6/1988 | Takemue et al. | 257/306 |
| 4,754,318 | 6/1988 | Momose et al. | 257/754 |
| 4,857,481 | 8/1989 | Tam et al. | 437/182 |
| 4,866,009 | 9/1989 | Matsuda | 437/203 |
| 4,933,739 | 6/1990 | Harari | 257/380 |
| 4,994,410 | 2/1991 | Sun et al. | 437/192 |
| 4,994,893 | 2/1991 | Ozaki et al. | 257/306 |
| 5,028,990 | 7/1991 | Kotaki et al. | 257/306 |
| 5,094,981 | 3/1992 | Chung et al. | 437/190 |
| 5,150,276 | 9/1992 | Gonzalez et al. | 257/296 |
| 5,200,359 | 4/1993 | Pearey et al. | 437/192 |
| 5,209,817 | 5/1993 | Ahmad et al. | 156/643 |
| 5,218,219 | 6/1993 | Ajika et al. | 257/306 |
| 5,225,699 | 7/1993 | Nakamura | 257/385 |
| 5,229,307 | 7/1993 | Vora et al. | 437/31 |
| 5,229,645 | 7/1993 | Nakashima | 257/773 |
| 5,243,219 | 9/1993 | Katayama | 257/400 |
| 5,247,197 | 9/1993 | Ema | 257/296 |
| 5,250,830 | 10/1993 | Yagishita et al. | 257/382 |
| 5,296,407 | 3/1994 | Eguchi | 437/195 |
| 5,317,193 | 5/1994 | Watanbe | 257/774 |
| 5,321,648 | 6/1994 | Dennison | 365/149 |
| 5,399,890 | 3/1995 | Okada et al. | 257/306 |
| 5,440,167 | 8/1995 | Iranmanesh | 257/530 |

FOREIGN PATENT DOCUMENTS

| | | | |
|---|---|---|---|
| 0098667 | 6/1985 | Japan | 237/773 |
| 4369217 | 12/1992 | Japan | |

*Primary Examiner*—Tom Thomas
*Assistant Examiner*—Alexander Oscar Williams
*Attorney, Agent, or Firm*—Killworth, Gottman, Hagan & Schaeff, L.L.P.

[57] ABSTRACT

A semiconductor device and fabrication process wherein the device includes a conductive layer with a localized thick region positioned below the contact hole. In one embodiment of the invention, the thick region to which contact is made is formed by means of an opening in an underlayer of material. This embodiment of the device includes an underlayer of material having an opening therein; a layer of thin conductive material formed on the underlayer and in the opening; an overlayer of material having a contact hole therethrough formed on the layer of thin conductive material; a conductor contacting the layer of thin conductive material through the contact hole; and wherein the opening in the underlayer is positioned below the contact hole and sized and shaped to form a localized thick region in the layer of thin conductive material within the opening.

17 Claims, 9 Drawing Sheets

SEMICONDUCTOR DEVICE HAVING IMPROVED CONTACTS TO A THIN CONDUCTIVE LAYER

CROSS REFERENCES TO RELATED APPLICATIONS

This application is a continuation, of application Ser. No. 08/475,454, filed Jun. 5, 1995 now abandoned which is a divisional application of application Ser. No. 08/399,844 filed on Mar. 7, 1995 now abandoned by H. Rhodes, entitled Semiconductor Device Having Improved Contacts To A Thin Conducting Layer And Process For Making Said Device.

FIELD OF THE INVENTION

The invention relates generally to the formation of a semiconductor device and process for making the device and, more particularly, to a semiconductor device having a localized thick region in a thin conductive layer for making electrical contact to a conductor.

BACKGROUND OF THE INVENTION

Generally, semiconductor devices are formed by alternately stacking layers of conducting and insulating materials over a semiconductor substrate. Contact holes are etched through some or all of these layers at specific locations and, thereafter, metal conductors are deposited into the holes to provide for electrical contact to external circuits. Contact holes are typically etched down to active areas on the surface of the substrate or to an intervening conductive layer. Variations in the thickness of the layers of material, non-uniformity of the film deposition and planarizing processes and limitations inherent in the etching process make it difficult to ensure the contact hole will stop precisely on the conductive layer to which contact will be made. This is particularly true as the conductive layers are made thinner for the increasingly small memory cell components currently being incorporated into random access semiconductor memory devices. Where contact must be made to a conductive layer that is thin in comparison to the overlaying materials through which the contact hole is etched, the contact hole etch must be precisely controlled to maximize the chances the hole stops on the thin conductive layer.

The problems associated with forming reliable contacts to a thin conductive layer are illustrated below where I have described part of a process for manufacturing a conventional stacked capacitor DRAM. FIG. 1 shows the structure of a conventional stacked capacitor DRAM after formation of the capacitor top electrode, also commonly referred to as the "cell poly." Cell poly 2 is a layer of doped polysilicon formed over dielectric layer 4, capacitor bottom electrode 6, field effect transistor gate electrode 8, and substrate 10.

Referring to FIG. 2, upper insulating layer 12 is stacked over substrate 10. Upper insulating layer 12 is etched to form a contact hole 14 which, ideally, extends just down to cell poly 2. In order to minimize the number of manufacturing process steps, this contact hole etch is typically performed as part of the same etch that forms bit line contact 15. Contact hole 14 is then filled with a metal conductor 16 for electrically connecting the cell poly to an external voltage source.

Upper insulating layer 12 and cell poly 2 are typically about 20,000 Angstroms and 1,000 Angstroms thick, respectively. The thickness of upper insulating layer 12 may vary from place to place due to the stepped substrate materials over which it is formed and non-uniformity of the film deposition and planarizing processes. Also, the contact hole etch must continue long enough to expose the deepest contact, bit line contact 15 in this example, at the thickest part of upper insulating layer 12. Hence, the contact hole will be over etched into and sometimes through the thin cell poly as illustrated in FIG. 3A. Etching through cell poly 2 diminishes the effectiveness of the cell poly/metal contact by forming a sidewall contact causing undesirable high contact resistance between conductor 16 and cell poly 2. Where the cell poly is formed in close proximity to the substrate, as shown in FIG. 3B, etching through cell poly 2 causes electrical shorting of cell poly 2 to substrate 10 through conductor 16.

Current methods to reduce the risk of over etching the cell poly contact hole include precisely controlled etch times and the development and use of highly selectively etch processes. Adequate selectivity is difficult to achieve, however, as device geometries shrink, bit line contacts become deeper and the cell polybecomes thinner.

One solution to the problem of shorting a thin conductive layer (described above for the cell poly) is disclosed in U.S. Pat. No. 5,243,219, issued to Katayama on Sep. 7, 1993. Katayama discloses an impurity diffused region in the substrate directly below the contact hole. The resulting pn junction between the impurity diffused region and the substrate isolates the conductive layer from the substrate in the event the contact hole is etched through the thin conductive layer. Although the device of Katayama minimizes some of the undesirable effects of etching through the thin conductive layer, it does not eliminate this fundamental problem which is inherent in the formation of reliable contacts to a thin conductive layer.

There remains a need for a structure and manufacturing process that lessens or eliminates the risk of etching the contact hole through a thin conductive layer. It is desirable that such structure and process be of practical use in a variety of semiconductor device applications, including those in which the conductive layer is remote from the substrate.

SUMMARY OF THE INVENTION

One object of the invention is to provide an improved contact to a relatively thin conductive layer.

Another object of the invention is to lessen the risk of etching the contact hole through the conductive layer to which contact will be made.

Another object is to prevent a shorting path or current leakage between the metal contact and underlying conductive or semiconductive materials.

According to the present invention, these and other objects are achieved by a semiconductor device having a conductive layer with a localized thick region positioned below the contact hole. In one embodiment of the invention, the thick region to which contact is made is formed by means of an opening in an underlayer of material. In this embodiment, the device includes an underlayer of material having an opening therein; a layer of thin conductive material formed on the underlayer and in the opening; an overlayer of material having a contact hole therethrough formed on the layer of thin conductive material; a conductor contacting the layer of thin conductive material through the contact hole; and wherein the opening in the underlayer is positioned below the contact hole and sized and shaped to form a localized thick region in the layer of thin conductive material within the opening.

In another embodiment, the invention is incorporated into a stacked capacitor DRAM. In this embodiment, the semiconductor device includes a field effect transistor formed in a memory cell array region of a semiconductor substrate, the field effect transistor having a gate electrode formed over the substrate, and first and second source/drain regions formed in the surface of the substrate on opposite sides of the gate electrode; a capacitor formed in the memory cell array region, the capacitor comprising a bottom electrode formed over the substrate in electrical contact with the first source/drain region, a dielectric layer formed on the bottom electrode, and a first region of a polysilicon top electrode formed on the dielectric over the bottom electrode; a second region of the polysilicon top electrode formed in a peripheral region of the substrate adjacent to the memory cell array region; an underlayer of material interposed between the substrate and the second region of the polysilicon top electrode in the peripheral region; an opening in the underlayer; an insulating layer formed on the second region of the polysilicon top electrode; a contact hole through the insulating layer; a conductor contacting the second region of the polysilicon top electrode through the contact hole; and wherein the opening in the underlayer is positioned below the contact hole.

A process for making a semiconductor device according to the invention includes the steps of: forming a first layer of thin conductive material; forming a second layer of material having a contact hole therethrough on the first layer; forming a localized thick region in the first layer and positioning the thick region below the contact hole; and forming a conductor contacting the thick region through the contact hole.

The semiconductor device of the invention, wherein the conductive layer has a localized thick region formed and positioned directly below the contact hole, eliminates the risk of etching the contact hole through the conductive layer, improves the conductive layer/conductor contact and prevents current leakage between the conductor and the substrate or other structure underlying the conductive layer.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

The figures are not meant to be actual views of the various embodiments, but merely idealized representations used to depict the structure and process of the invention.

DETAILED DESCRIPTION OF THE PREFERRED EMBODIMENTS

The fabrication of semiconductor devices includes etching predetermined patterns into various layers of material formed during fabrication of the device. This process is referred to herein as "patterning and etching." Photolithography and reactive ion etching, for example, are commonly used pattern and etch processes. These or other pattern and etch processes, well known to those skilled in the art, may be used to implement the present invention.

Reference will now be made to FIGS. 4–7, which illustrate the general structure of one embodiment of the invention without regard to the specific type of semiconductor device into which the invention might be incorporated. FIGS. 11–16, which are discussed later, illustrate one preferred application for the invention wherein the invention is incorporated into a stacked capacitor DRAM.

Figure 1:
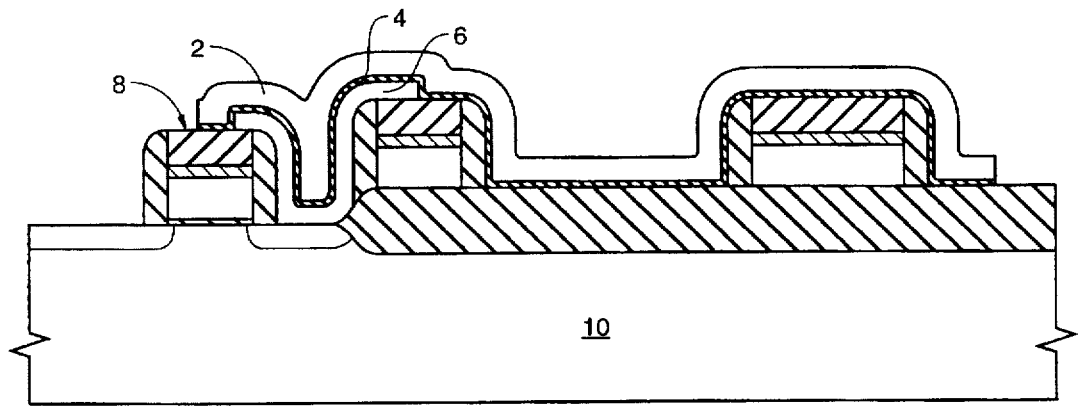
FIGS. 1 and 2 are cross sectional views of a portion of a conventional stacked capacitor DRAM at various stages of formation.
Figure 2:
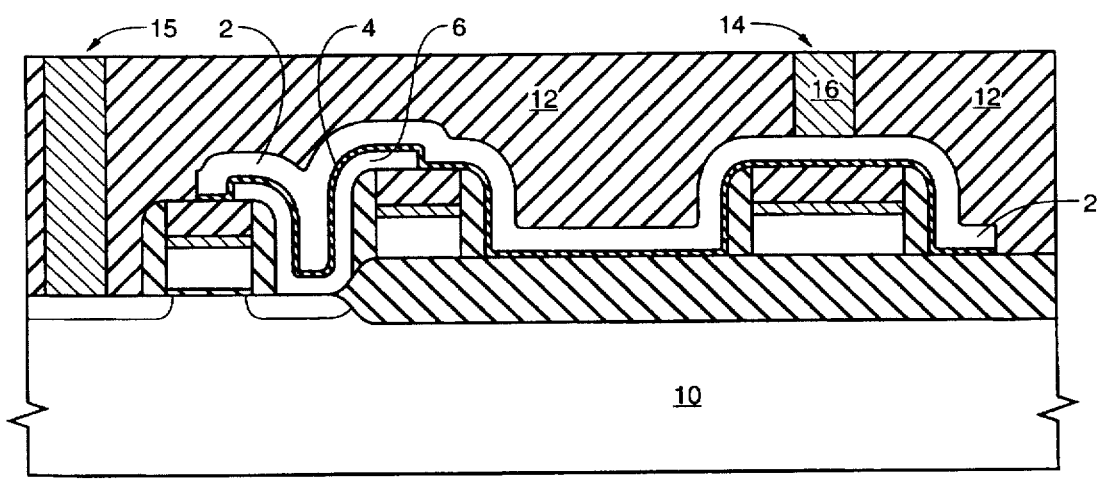
Figure 3A:
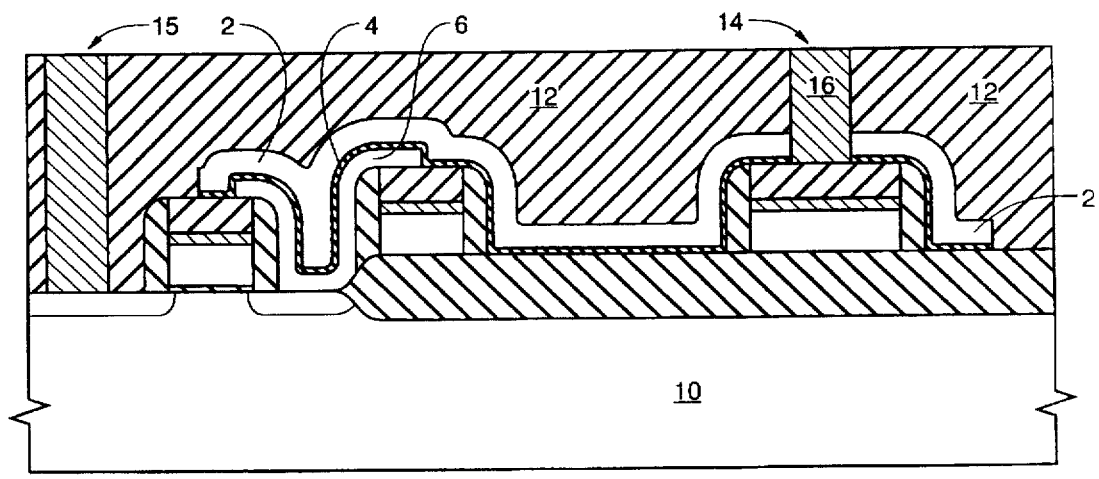
FIG. 3A is a cross sectional view of a portion of a conventional stacked capacitor DRAM showing the contact hole etched through the cell poly.
Figure 3B:
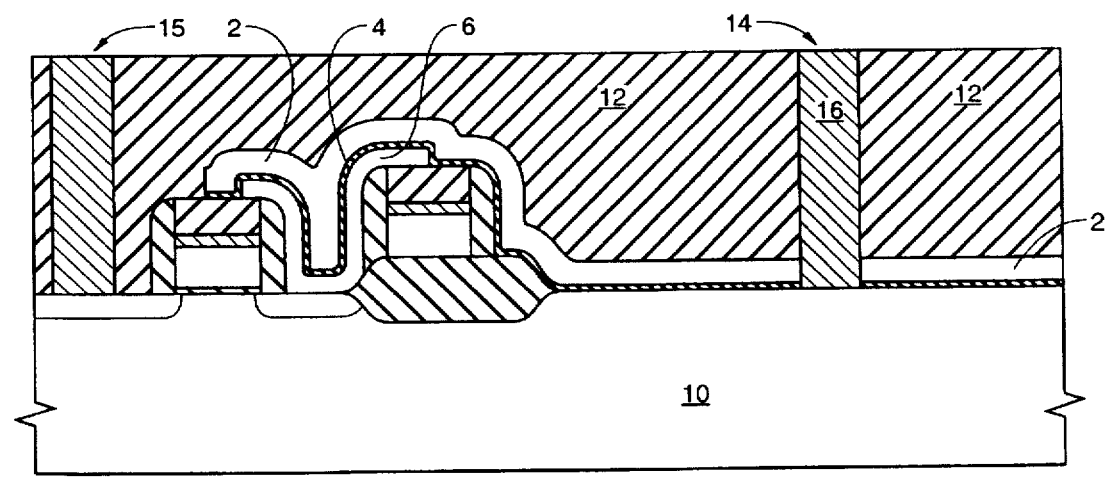
FIG. 3B is a cross sectional view of a portion of a conventional stacked capacitor DRAM showing the contact hole etched through the cell poly with the cell poly in close proximity to the substrate.
Figure 4:
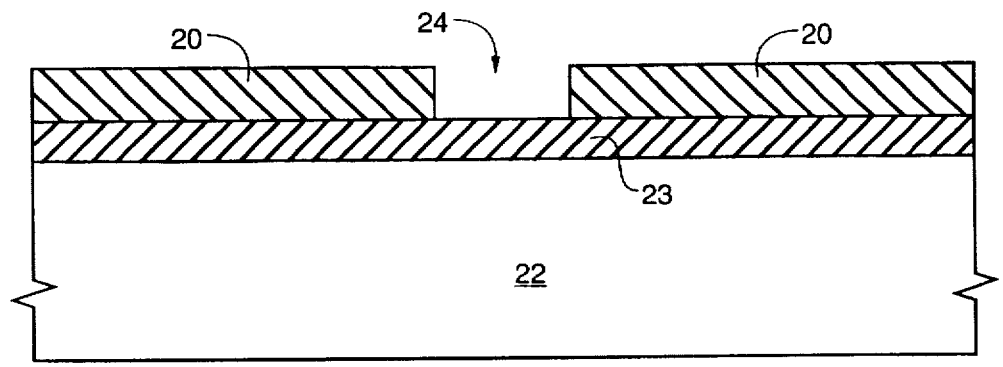
FIGS. 4–7 are cross sectional views illustrating the general structure of one of the preferred embodiments of the invention at various stages of formation.
Figure 5:
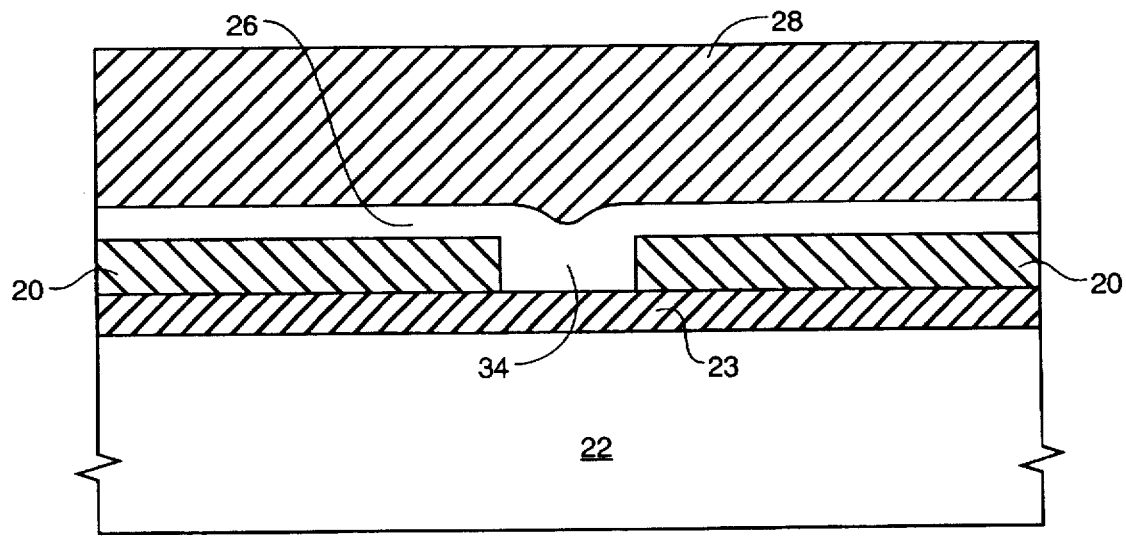

Referring to FIG. 4, insulating layer 23 and underlayer 20 have been formed over substrate 22. Underlayer 20 is patterned and etched to form opening 24. Opening 24 need not be etched all the way through underlayer 20. All that is required is a step opening in underlayer 20. A layer of conductive material 26 is then formed over underlayer 20 and in opening 24 as shown in FIG. 5. Insulating layer 23 is provided to prevent electrical shorting between conductive layer 26 and substrate 22. If shorting between conductive layer 26 and substrate 22 is not a problem, then insulating layer 23 may be omitted. Other layers may also be formed between substrate 22 and underlayer 20. Overlayer 28 is then formed on conductive layer 26.

Figure 6:
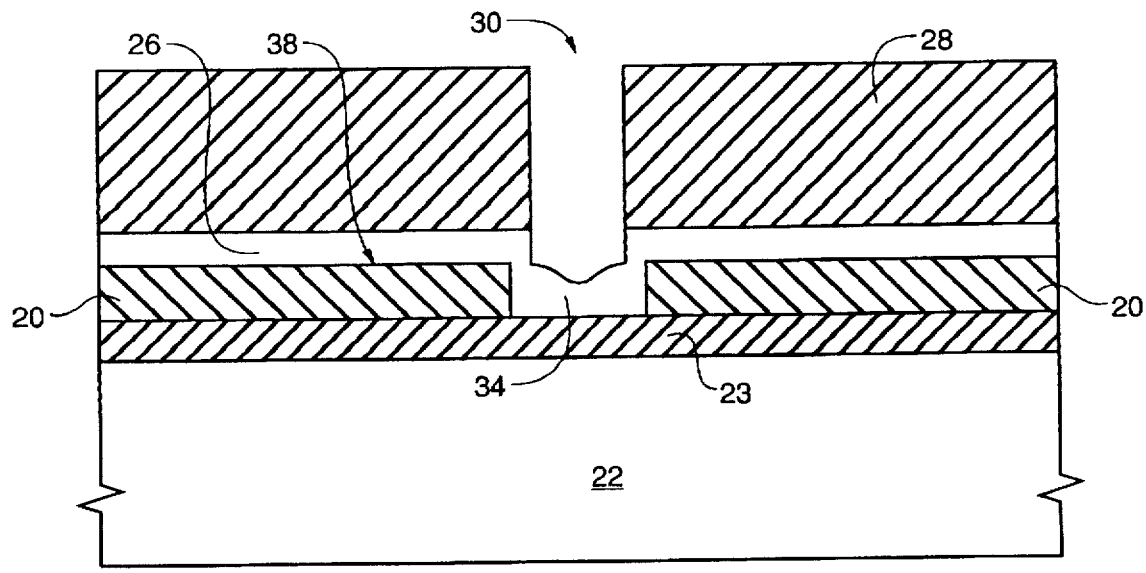
Figure 7:
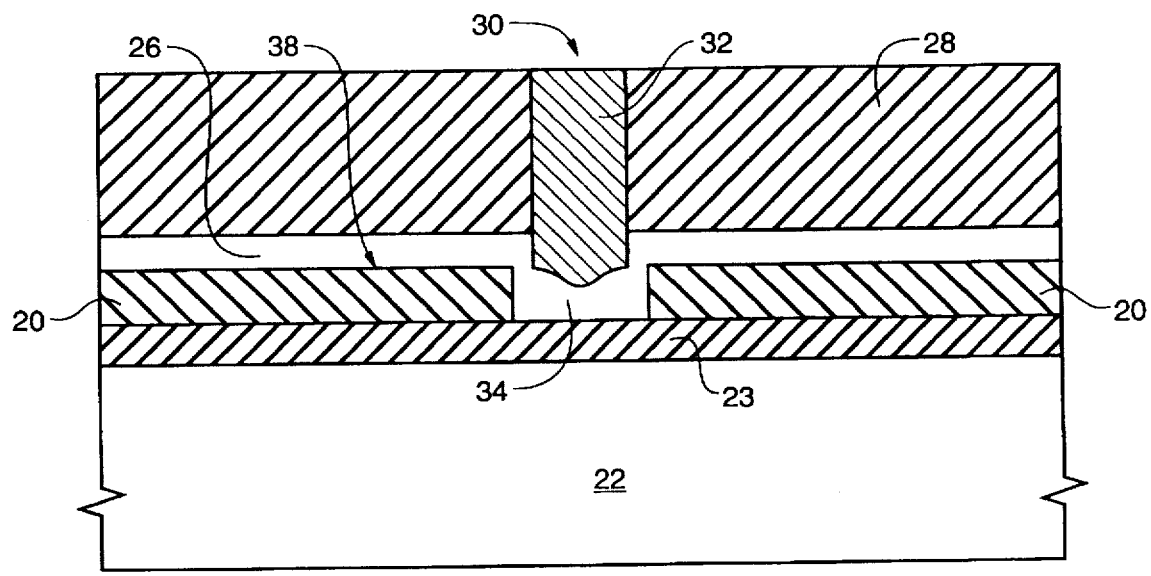

Referring to FIG. 6, overlayer 28 is patterned and etched to form contact hole 30. Conductor 32 is then formed in contact hole 30 as shown in FIG. 7. Typically, underlayer 20 will be made of an insulating material such as silicon dioxide or a composite stack of conducting and insulating materials. Conductive layer 26 is doped polysilicon and overlayer 28 is boro-phospho-silicate glass (BPSG) or other suitable insulating material. Although the relative thicknesses of conductive layer 26 and overlayer 28 are not critical to the invention, the objectives of the invention are better realized where, as in most semiconductor applications, overlayer 28 is much thicker than conductive layer 26.

Opening 24 is sized and shaped to form localized thick region 34 in conductive layer 26 within opening 24. Opening 24 and thick region 34 are formed subjacent to contact hole 30, that is, below and adjacent to contact hole 30. Opening 24 and thick region 34 are preferably positioned directly below contact hole 30 as shown in FIG. 6, although a reliable contact will be made even in the event of substantial misalignment of contact hole 30 to opening 24. In this embodiment, the width (or diameter) of opening 24 is less than or equal to twice the product of the thickness of conductive layer 26 at surface 38 of underlayer 20 adjacent to opening 24 and the Conformality of the conductive material. Thus, for conductive material having Conformality C and thickness T, the width W of opening 24 is determined from the following equation: $W \leq 2 \times T \times C$. In this way, conductive layer 26 will completely fill opening 24. Unless otherwise noted, the "thickness" of a layer of material, as used herein, refers to the thickness measured in a direction parallel to the longitudinal axis describing the depth of the contact hole. Hence, for the orientation of the layers of material illustrated in the drawings, "thickness" refers to the vertical thickness of the material.

The Conformality of a particular material, as is well known in the art, represents the comparative rate at which a material is simultaneously deposited along the top surface and sidewall of an opening or "step" in the underlying material. Conformality is defined by the ratio of the thickness of the deposited material along the sidewall of a step in the underlying material and its thickness along the surface adjacent to the step. Polysilicon, for example, has a Conformality of about 0.80. If conductive layer 26 is made of polysilicon having a thickness of 1,500 angstrom at surface 38 of underlayer 20, then the width of opening 24 preferably is less than or equal to 2,400 Angstroms (2×1,500 Angstroms×0.80). This will ensure conductive layer 26 completely fills opening 24 to form a robust thick region 34. Thick region 34 allows for a reliable contact to conductor 32 even in the event of a substantial contact hole overetch as shown in FIG. 7.

Opening 24 should be deep enough so that thick region 34 is sufficiently thick to accommodate anticipated overetching of contact hole 30. Overetching, as applied herein to contact hole 30, refers to the continuation of the etch after contact hole 30 has reached the nominal depth of conductive layer 26 below overlayer 28. In many semiconductor device applications, overlayer 28 will be formed over a structure having a stepped topography, resulting in variations in the thickness of overlayer 28. The thickness of overlayer 28 may also vary due to non-uniformity in deposition and planarization processes. Contact hole 30 must overetched as necessary to account for such variations. Other factors may also effect the contact hole etch. For example, the contact hole may be etched simultaneously with a deeper bit line contact as in the stacked capacitor DRAM described below. In this example, the etch must continue until the deeper bit line contact is reached, resulting in a substantial overetch of contact hole 30.

In general, the depth of opening 24 will depend upon the nominal depth of contact hole 30, the total effective depth of the etch during which contact hole 30 is formed, and the selectivity of the etch. The total effective depth of this etch will be determined by the depth of the deepest contact being etched and any overetch of that deep contact. Selectivity is a measure of the etch rate of the target material (overlayer 28 in this example) relative to other materials of interest exposed to the etchant (conductive layer 26). Selectivity is defined by the following equation: $S_{AB}=E_A/E_B$, where $E_A$ is the etch rate of the target material to be etched and $E_B$ is the etch rate of the second material of interest exposed to the etchant. For a contact hole having a nominal depth $D_{CH}$, a total etch depth $D_{TE}$, and etch selectivity S, the thickness $T_{TR}$ of thick region 34 is determined according to the following equation: $T_{TR} \geq (D_{TE}-D_{CH})/S$. The corresponding depth $D_O$ of opening 24 is determined according to the following equation: $D_O \geq (D_{TE}-D_{CH})/S-T_{CL}$, where $T_{CL}$ is the thickness of conductive layer 26.

Figure 8:
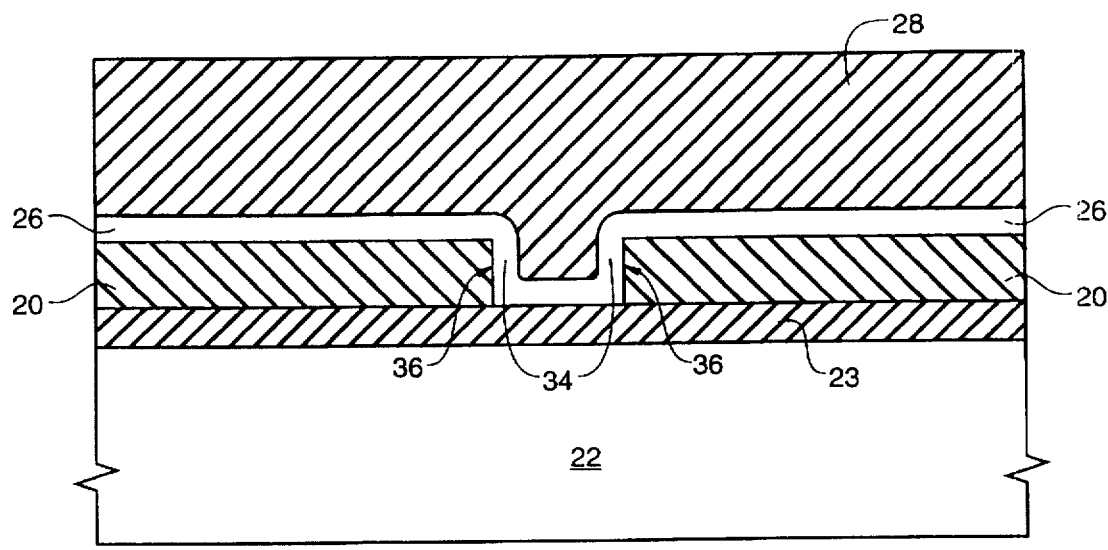
FIGS. 8–9 are cross sectional views illustrating another embodiment of the invention wherein the conductive layer/conductor contact is formed along a sidewall of the opening in the underlayer. The cross sectional view of FIG. 9 is taken along the line 1—1 in FIG. 10.
Figure 9:
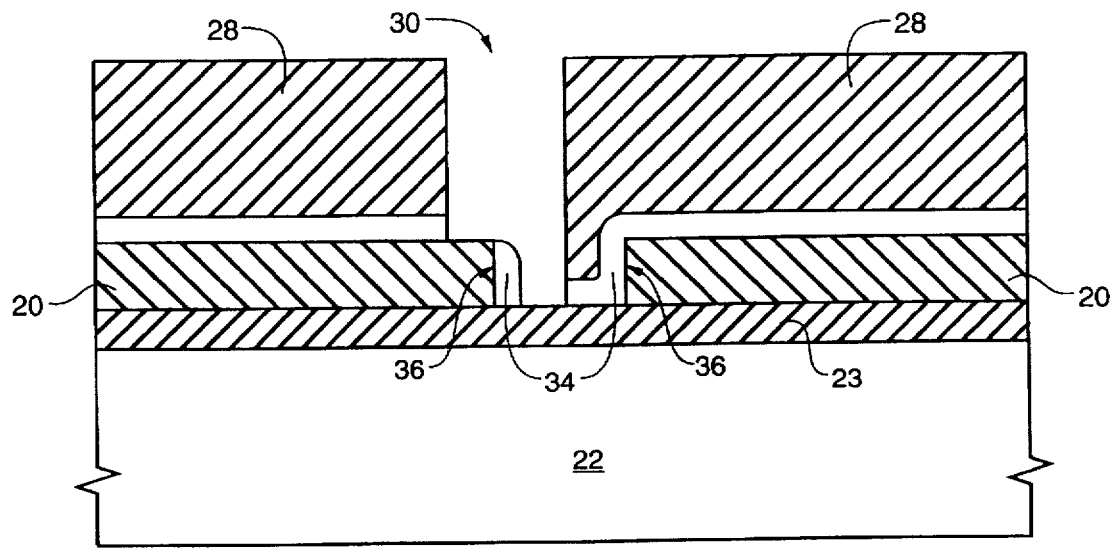
Figure 10:
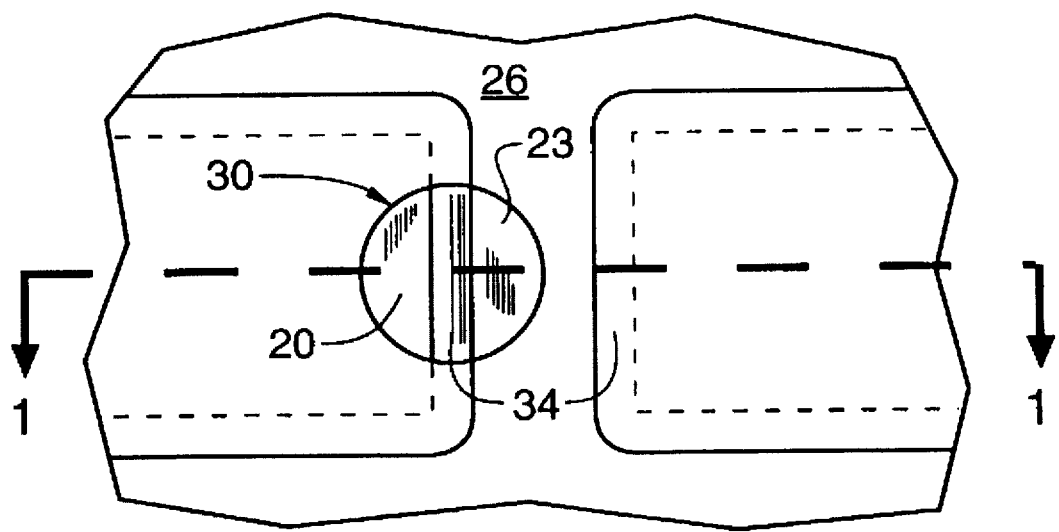
FIG. 10 is a top down plan view of the structure of FIG. 9, except that overlayer 28 in FIG. 9 is omitted, wherein the conductive layer/conductor contact is formed along a sidewall of the opening in the underlayer.

In another embodiment of the invention, illustrated in FIGS. 8–10, the localized thick region is formed as a spacer on the sidewall of the opening. Referring to FIG. 8, insulating layer 23 and underlayer 20 having opening 24 therein have been formed on substrate 22. Conductive layer 26 is formed over underlayer 20 and along the surfaces of opening 24, to form localized thick regions 34 along the sidewalls 36 of opening 24 (opening 24 is shown in FIG. 4). Overlayer 28 is then formed on conductive layer 26.

Referring to FIGS. 9 and 10, overlayer 28 is patterned and etched to form contact hole 30. FIG. 9 is a cross section view taken along the line 1—1 in FIG. 10. In the top down plan view of FIG. 10, however, overlayer 28 and conductor 32 have been removed to better illustrate the features of this embodiment of the invention. Contact hole 30 is thereafter filled with a conductor 32 to contact conductive layer 26 at thick region 34. In this embodiment, the width of opening 24 is not critical nor is it necessary that contact hole 30 be precisely aligned to opening 24. In practice, the structure illustrated in FIGS. 8–10 may be formed by design or this structure may result from overetching and/or misalignment of contact hole 30 in the structure shown in FIG. 6. The invention thus provides a reliable contact while allowing for generous etching and alignment tolerances.

Figure 14:
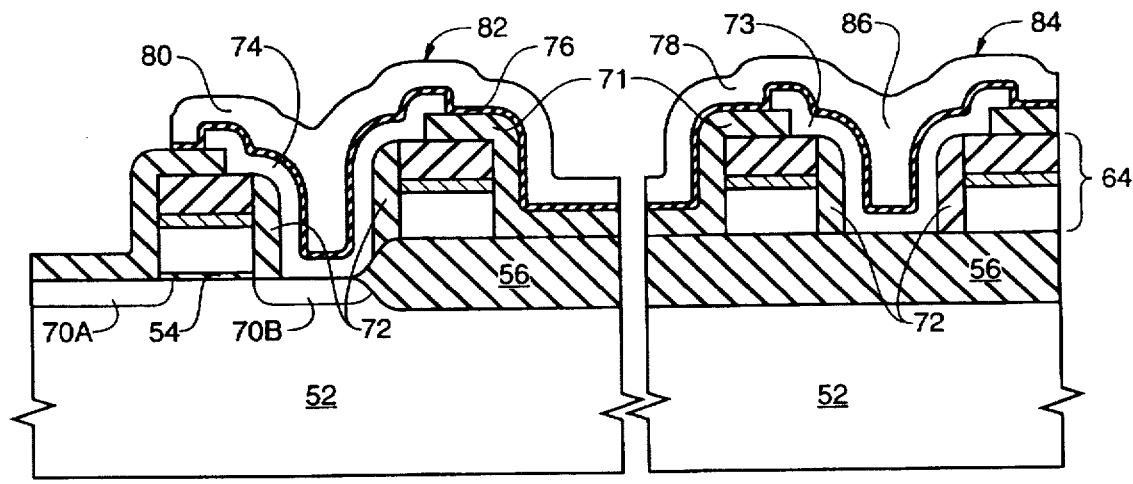
Figure 15:
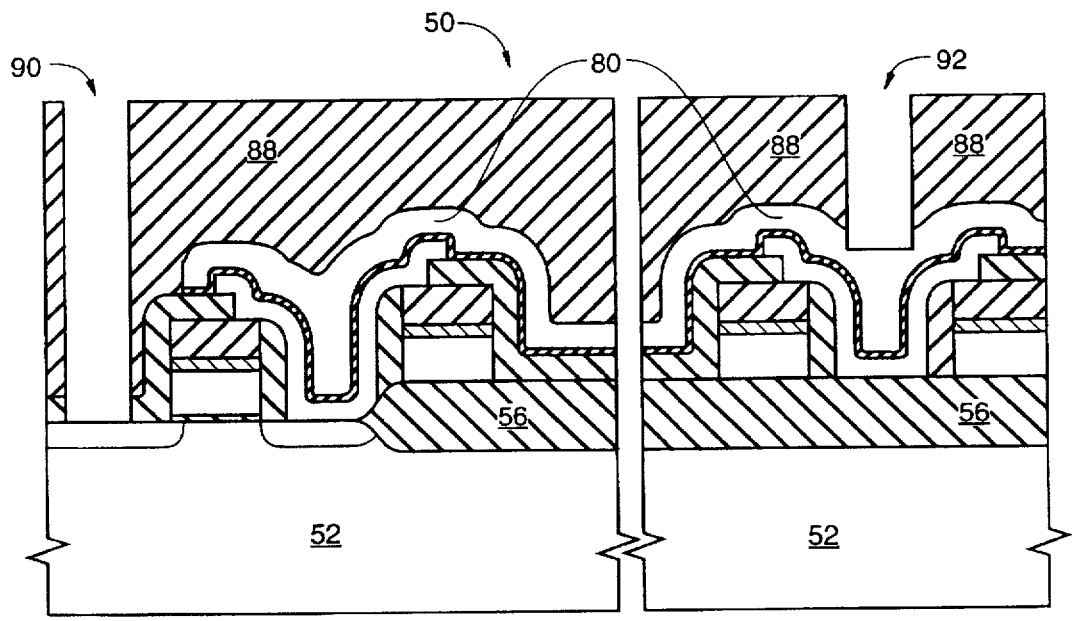
Figure 16:
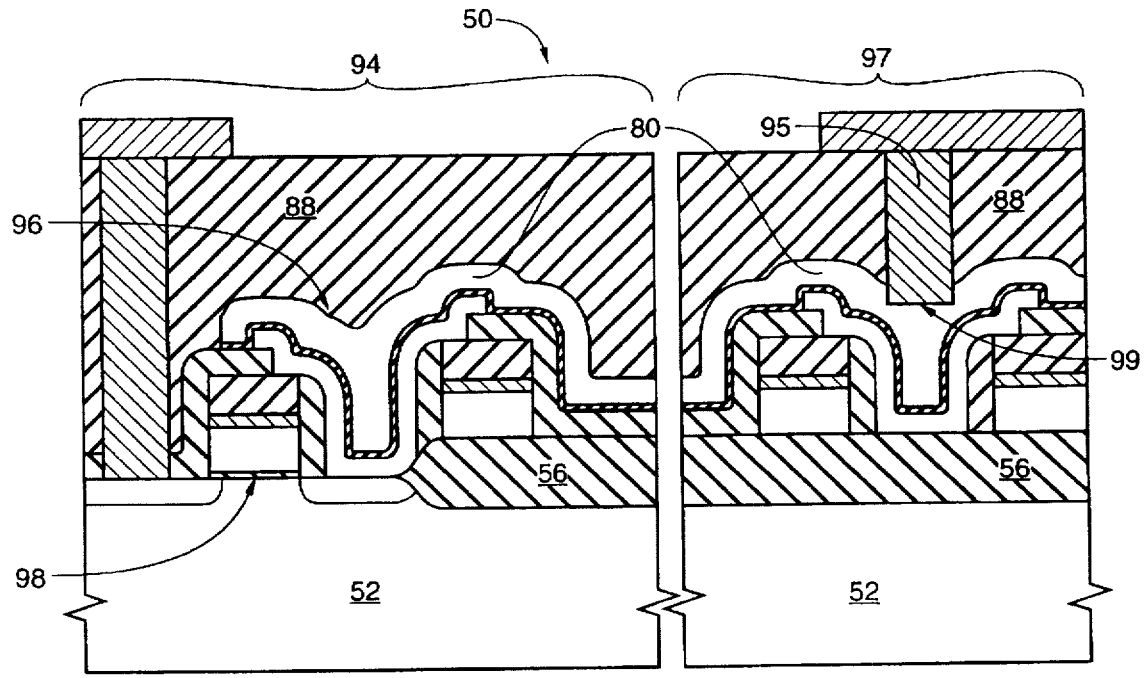

Reference will now be made to FIGS. 11–16, which illustrate application of the present invention to a stacked capacitor DRAM. Referring first to FIG. 16, one memory cell in a memory cell array region 94 of wafer 50 is shown on the left side of FIG. 16, including capacitor 96 and field effect access transistor 98. Metal conductor 95 contacting cell poly 80 at contact area 99 in a peripheral region 97, typically located immediately adjacent to the array region, is shown on the right side of FIG. 16. The components of the device illustrated in FIG. 16 and the process for making those components will be described with reference to FIGS. 11–15.

Figure 11:
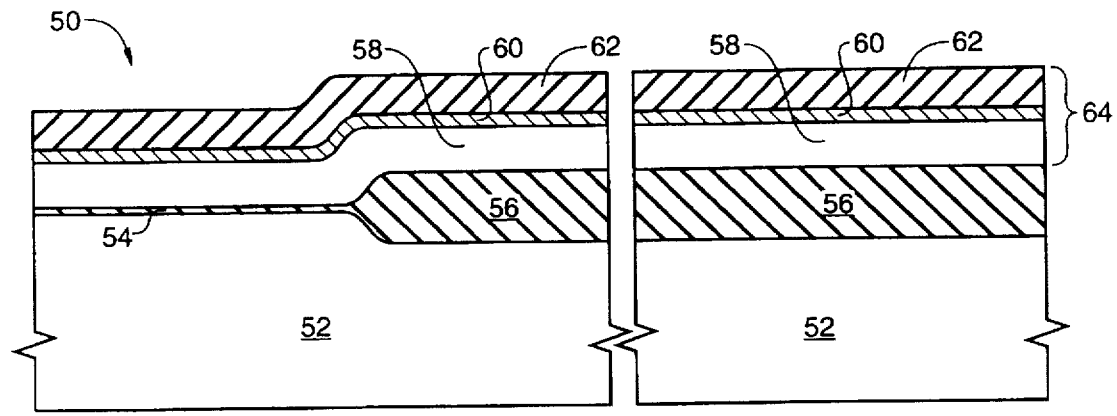
FIGS. 11–16 illustrate another preferred embodiment wherein the invention is incorporated into a stacked capacitor DRAM.

Referring to FIG. 11, wafer 50 comprises a lightly doped p-type single crystal silicon substrate 52 which has been oxidized to form thin gate insulating layer 54 and thick field oxide region 56. This application of the invention will be described using lightly doped p-type silicon as the starting material, although the invention may be implemented with other substrate materials. If other substrate materials are used, then there may be corresponding differences in materials and structure of the device as is well known in the art. Field oxide region 56 is formed by conventional methods well known in the art, such as forming an apertured layer of silicon nitride (not shown) or other non-oxidizable material on the surface of substrate 52 and thereafter oxidizing the exposed portions of the substrate. Thin gate insulating layer 54 is formed by thermally growing or depositing silicon dioxide on the surface of substrate 52. First polysilicon layer 58, tungsten silicide layer 60 and silicon dioxide layer 62 are then deposited or "stacked" over substrate 52. First polysilicon layer 58, tungsten silicide layer 60 and silicon dioxide layer 62 are referred to jointly as underlayer 64.

Figure 12:
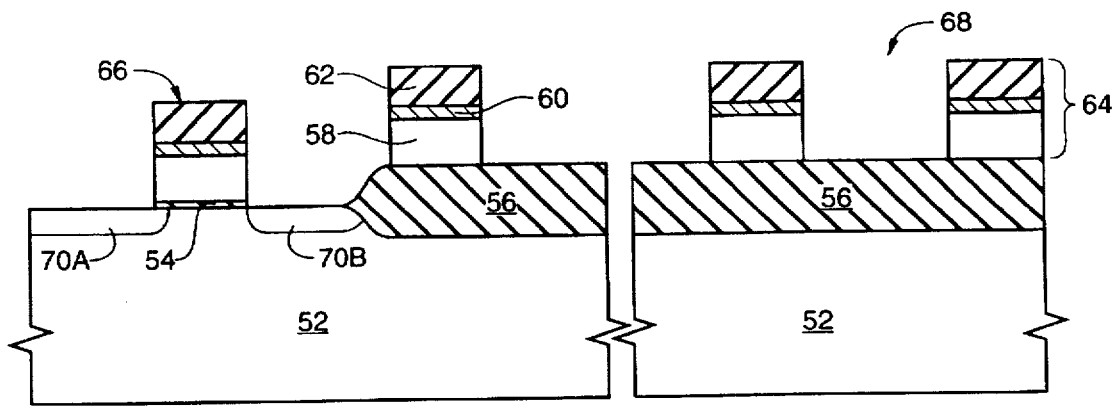

Referring to FIG. 12, underlayer 64 is patterned and etched to form transistor gate electrode 66 in the array and opening 68 in the periphery. These layers are deposited, patterned and etched using conventional methods well known in the art. Alternatively, gate electrode 66 and opening 68 may be formed in a single layer of polysilicon deposited and etched as describe above or other combinations of conductors and insulators may be used. The tungsten silicide and silicon dioxide layers are included herein simply to better illustrate the details of one of the preferred embodiments of the invention. Source/drain regions 70a and 70b are formed in the array by implanting n-type impurities, typically phosphorous or arsenic atoms, into substrate 52 on opposite sides of gate electrode 66.

Figure 13:
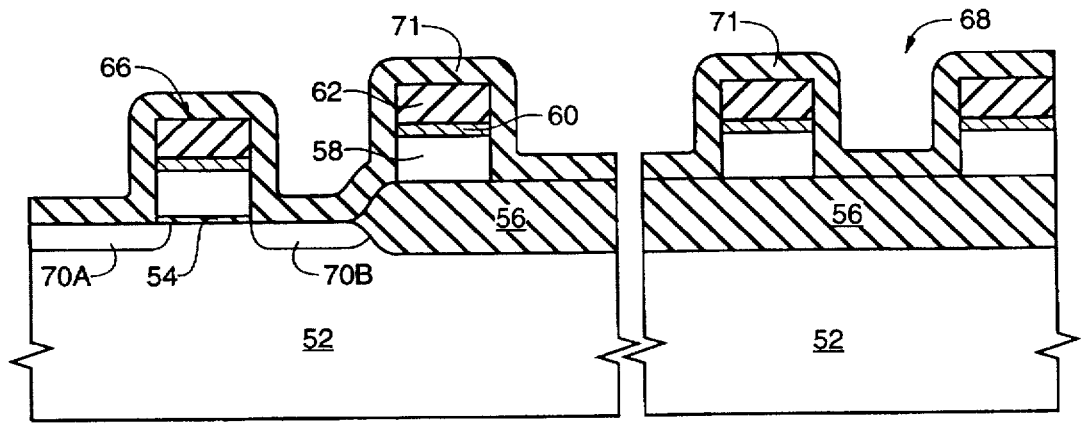

Referring to FIG. 13, insulating layer 71, typically made of silicon dioxide, is stacked over substrate 52. Referring to FIG. 14, insulating layer 71 is patterned and etched to form spacers 72. A second polysilicon layer 73 is then stacked over substrate 52 and patterned and etched to form capacitor bottom electrode 74. Capacitor dielectric layer 76, typically made of silicon nitride, is stacked over substrate 52. A third polysilicon layer is then stacked over substrate 52 and patterned and etched to form capacitor top electrode 80, also commonly referred to as the "cell poly", as shown in FIG. 15, and this etch may continue down through dielectric layer 76. Thus, a first region 82 of cell poly 80 is formed in the array over bottom electrode 74 and a second region 84 of cell poly 80 has been formed in the periphery for subsequent connection to a metal conductor.

Referring again to FIG. 14, opening 68 (shown in FIGS. 12 and 13) has now been filled with spacers 72, second polysilicon layer 73, dielectric layer 76 and cell poly 80. Opening 68 is sized and shaped to form localized thick region 86 in cell poly 80 within opening 68. To ensure that cell poly 80 bridges the gap in opening 68 to form localized thick region 86, the width of opening 68 should be no greater than the combined widths of spacers 72, second polysilicon layer 73, dielectric layer 76 and cell poly 80 within opening 68. The width of each of these materials within opening 68 is proportional to the thickness at which those materials are formed along the surface of underlayer 64 adjacent to opening 68. The width of opening 68 can, therefore, be determined according to the following equation, where insulating layer 71 has a thickness $T_I$ and Conformality $C_I$, second polysilicon layer 73 has thickness $T_{PL}$ and Conformality $C_{PL}$, dielectric layer 76 has a thickness $T_d$ and Conformality $C_D$, and cell poly 80 has a thickness $T_{CP}$ and Conformality $C_{CP}$: $W \leq 2 \times ((T_I \times C_I) + (T_{PL} \times C_{PL}) + (T_D \times C_D) + (T_{CP} \times C_{CP}))$. Of course, if the width of each layer of material lying within opening 68 is otherwise known or can be determined directly, then the above described equation need not be applied. In general, however, the width an opening having multiple layers of materials deposited therein can be determined according to the following equation: $W \leq_{i=1}^{N} \Sigma 2 \times T_i \times C_i$, where each layer has a thickness T, as measured along the surface adjacent to the opening, and Conformality C.

Assuming a 4 Mbit DRAM having an access transistor gate about 0.6 μm wide, silicon dioxide insulating layer 71 has a thickness $T_I$ of approximately 3,000 Angstroms and Conformality $C_I$ of 0.67, second polysilicon layer 73 has a thickness $T_{PL}$ of approximately 2,000 Angstroms and Conformality $C_{PL}$ of 0.80, dielectric layer 76 has a thickness $T_D$ of approximately 100 Angstroms and Conformality $C_D$ of 0.90, and cell poly 80 has a thickness $T_{CP}$ of approximately 1,000 Angstroms and Conformality $C_{CP}$ of 0.80. Therefore, opening 68 preferably is no more than 9,000 Angstroms wide.

Referring to FIG. 15, overlayer layer 88, made of boro-phospho-silicate glass (BPSG) or other suitable insulator, is stacked over substrate 52. Overlayer 88 is patterned and etched to form bit line contact 90 in the array and contact hole 92 in the periphery. Opening 68 (shown on FIG. 12) is positioned directly below contact hole 92. Ideally, the contact hole etch will end on the surface of cell poly 80. As a practical matter, and due to the variations in the thickness of overlayer 88 and the greater depth of the bit line contact 90, contact hole 92 is typically over etched to ensure bit line contact 90 is etched to substrate 52. Consequently, the contact hole etch usually extends into the surface of cell poly 80, as illustrated in FIG. 15. The device structure is completed as shown in FIG. 16 using metallization processes well known in the art.

There has been shown and described a novel semiconductor device wherein a conductive layer has a localized thick region formed and positioned below the contact hole, thus eliminating the risk of etching the contact hole through the thin conductive layer. The particular embodiments shown in the drawings and described herein are for purposes of example and should not be construed to limit the invention as set forth in the appended claims. Those skilled in the art may now make numerous uses and modifications of the specific embodiments described without departing from the scope of the invention. For instance, the invention could be readily incorporated into trench capacitor DRAMs, Static Random Access Memories (SRAMs), logic circuit semiconductor devices and other such devices where a contact via is formed on a layer of relatively thin conductive material. The process steps described may in some instances be performed in a different order and/or equivalent structures and processes may be substituted for the various structures and processes described.

I claim:

1. A semiconductor device having an improved contact to a layer of conductive material, comprising:

a first layer of material having an opening therein;

a layer of a first conductive material on said first layer of material, said first conductive material substantially filling said opening in said first layer to form a localized thick region;

an overlayer of material on said layer of said first conductive material, said overlayer including a contact hole therethrough communicating with said layer of said first conductive material; and a second conductive material, which differs in composition from said first conductive material, substantially filling said contact hole in said overlayer and contacting said first conductive material.

2. A semiconductor device as claimed in claim 1 wherein said localized thick region is positioned directly beneath said contact hole.

3. A semiconductor device as claimed in claim 1 in which said first conductive material comprises polysilicon and said second conductive material comprises a metal.

4. A semiconductor device as claimed in claim 1 in which said first layer and said overlayer comprise an insulating material.

5. A semiconductor device as claimed in claim 1 in which said layer of said first conductive material has a Conformality C, a thickness $T_1$ at a location along a surface of said first layer adjacent said opening, and said opening has a width W, where the width of said opening is determined by the equation: $W \leq 2 \times T_1 \times C$.

6. A semiconductor device having an improved contact to a layer of conductive material, comprising:

a first layer of material having an opening therein;

a capacitor formed in said opening, said capacitor comprising a bottom electrode and a top electrode electrically isolated from the bottom electrode by a dielectric layer, said top electrode comprising a layer of a first conductive material which substantially fills said opening in said first layer to form a localized thick region of said first conductive material;

an overlayer of material on said top electrode, said overlayer including a contact hole therethrough communicating with said first conductive material in said top electrode; and a second conductive material, which differs in composition from said first conductive material, substantially filling said contact hole in said overlayer and contacting said first conductive material in said top electrode.

7. A semiconductor device as claimed in claim 6 wherein said localized thick region is positioned directly beneath said contact hole.

8. A semiconductor device as claimed in claim 6 in which said first conductive material comprises polysilicon and said second conductive material comprises a metal.

9. A semiconductor device, comprising:
- a field effect transistor formed in a memory cell array region of a semiconductor substrate, said field effect transistor comprising a gate electrode formed on said substrate, and first and second source/drain regions formed in the surface of the substrate on opposite sides of said gate electrode;
- a capacitor formed in said memory cell array region, said capacitor comprising a bottom electrode formed on said substrate in electrical contact with said first source/drain region, a dielectric layer formed on said bottom electrode, and a first region of a top electrode formed on said dielectric layer, said top electrode comprising a first conductive material;
- a second region of said top electrode formed in a peripheral region of the substrate adjacent to said memory cell array region;
- an underlayer of material interposed between said substrate and said second region of said top electrode in said peripheral region, said underlayer having an opening therein, said top electrode substantially filling said opening;
- an overlayer of material formed on said second region of said top electrode, said overlayer including a contact hole therethrough communicating with said top electrode; and
- a second conductive material, which differs in composition from said first conductive material, substantially filling said contact hole and contacting said second region of said top electrode.

10. A semiconductor device as claimed in claim 9 wherein said first conductive material in said second region of said top electrode forms a localized thick region of said first conductive material beneath said contact hole.

11. A semiconductor device as claimed in claim 9 in which said first conductive material comprises polysilicon.

12. A semiconductor as claimed in claim 9 in which said second conductive material comprises a metal.

13. A semiconductor device having an improved contact to a conductive layer comprising:
- a first layer of material having an opening therein, said opening including sidewalls;
- a layer of a first conductive material on said first layer of material, said first conductive material being formed on said first layer and along the surfaces of said sidewalls of said opening to form a localized thick region;
- an overlayer of material on said layer of said first conductive material, said overlayer including a contact hole therethrough communicating with said layer of said first conductive material;
- a second conductive material, which differs in composition from said first conductive material, substantially filling said contact hole in said overlayer and contacting said first conductive material.

14. A semiconductor device as claimed in claim 13 in which said first conductive material forms a spacer on said sidewall of said opening.

15. A semiconductor device as claimed in claim 14 in which said second conductive material contacts at least said spacer.

16. A semiconductor device as claimed in claim 13 in which said first conductive material comprises polysilicon and said second conductive material comprises a metal.

17. A semiconductor device as claimed in claim 13 in which said first layer and said overlayer comprise an insulating material.

* * * * *

UNITED STATES PATENT AND TRADEMARK OFFICE
CERTIFICATE OF CORRECTION

PATENT NO. : 5,731,610
DATED : March 24, 1998
INVENTOR(S) : Howard E. Rhodes and Luan Tran It is certified that error appears in the above-indentified patent and that said Letters Patent is hereby corrected as shown below:

Title page item,
[75] Inventor: Howard E. Rhodes, Boise, Id. should read

-- [75] Inventors: Howard E. Rhodes, Boise, Id., and Luan Tran, Meridian, Id. --.

Signed and Sealed this

Twenty-third Day of June, 1998

Attest:

*Attesting Officer*

BRUCE LEHMAN

*Commissioner of Patents and Trademarks*